United States Patent
Peattie et al.

(10) Patent No.: US 11,442,844 B1
(45) Date of Patent: Sep. 13, 2022

(54) HIGH SPEED DEBUG HUB FOR DEBUGGING DESIGNS IN AN INTEGRATED CIRCUIT

(71) Applicant: Xilinx, Inc., San Jose, CA (US)

(72) Inventors: Michael E. Peattie, Campbell, CA (US); Niloy Roy, Hyderabad (IN); Vishal Kumar Vangala, Hyderabad (IN)

(73) Assignee: Xilinx, Inc., San Jose, CA (US)

( * ) Notice: Subject to any disclaimer, the term of this patent is extended or adjusted under 35 U.S.C. 154(b) by 213 days.

(21) Appl. No.: 16/889,590

(22) Filed: Jun. 1, 2020

(51) Int. Cl.
G06F 11/00 (2006.01)
G06F 11/36 (2006.01)
G06F 11/27 (2006.01)
H04L 49/109 (2022.01)
G01R 31/3185 (2006.01)
G06F 11/07 (2006.01)

(52) U.S. Cl.
CPC .. G06F 11/3656 (2013.01); G01R 31/318533 (2013.01); G06F 11/0751 (2013.01); G06F 11/27 (2013.01); H04L 49/109 (2013.01)

(58) Field of Classification Search
CPC .. G06F 11/0751; G06F 11/27; G06F 11/3656; G01R 31/318533
See application file for complete search history.

(56) References Cited

U.S. PATENT DOCUMENTS

| | | | |
|---|---|---|---|
| 5,995,744 A | 11/1999 | Guccione | |
| 6,142,683 A * | 11/2000 | Madduri | G06F 11/3664 714/E11.212 |
| 6,212,650 B1 | 4/2001 | Guccione | |
| 6,985,980 B1 | 1/2006 | Allegrucci | |
| 7,308,564 B1 | 12/2007 | Jenkins, IV | |
| 7,565,576 B2 * | 7/2009 | Seroff | G06F 11/3648 714/45 |
| 7,805,593 B1 | 9/2010 | Donlin | |
| 8,327,200 B1 | 12/2012 | Mohan | |
| 8,595,555 B1 | 11/2013 | Taylor | |
| 8,595,561 B1 | 11/2013 | Lu et al. | |
| 9,424,166 B2 * | 8/2016 | Hopkins | G01R 31/31723 |
| 9,632,895 B2 * | 4/2017 | Menon | G06F 11/3656 |
| 10,067,854 B2 | 9/2018 | Villarreal et al. | |
| 10,110,234 B1 | 10/2018 | Durairajan et al. | |
| 10,235,272 B2 | 3/2019 | Villarreal et al. | |
| 2006/0288254 A1 * | 12/2006 | Agarwala | G06F 11/3636 714/30 |
| 2010/0100770 A1 * | 4/2010 | Mejdrich | G06F 11/362 714/37 |
| 2013/0111274 A1 * | 5/2013 | Hopkins | G06F 11/3656 714/45 |

(Continued)

*Primary Examiner* — Elmira Mehrmanesh
(74) *Attorney, Agent, or Firm* — Kevin T. Cuenot

(57) ABSTRACT

An integrated circuit includes a high-speed interface configured to communicate with a host system for debugging and a debug hub coupled to the high-speed interface. The debug hub is configured to receive a debug command from the host system as memory mapped data. The integrated circuit also includes a plurality of debug cores coupled to the debug hub. Each debug core is coupled to the debug hub by channels. The debug hub is configured to translate the debug command to a data stream and provide the data stream to a target debug core of the plurality of debug cores based on an address specified by the debug command.

18 Claims, 6 Drawing Sheets

(56) References Cited

U.S. PATENT DOCUMENTS

| | | | | |
|---|---|---|---|---|
| 2013/0238933 A1* | 9/2013 | Shin | ............ | G06F 11/27 |
| | | | | 714/30 |
| 2013/0339789 A1* | 12/2013 | Menon | ............ | G06F 11/3656 |
| | | | | 714/E11.17 |
| 2015/0355991 A1* | 12/2015 | Yeh | ............ | G06F 11/3075 |
| | | | | 714/45 |
| 2017/0115344 A1* | 4/2017 | Kuehnis | ............ | G01R 31/3177 |

* cited by examiner

400

Receive, within a debug hub of an integrated circuit, a debug command from a host system, wherein the debug command is received over a high speed interface coupled to the host system and the debug hub is coupled to a plurality of cores of the integrated circuit through a plurality of channels
402

Determine an address from the debug command, wherein the address corresponds to a target debug core of a plurality of debug cores and a first selected channel of the plurality of channels, wherein the first selected channel is connected to the target debug core
404

Convert the debug command from memory mapped data to stream data
406

Send the debug command to the target debug core via the first selected channel
408

Receive debug data from the target debug core over a second selected channel connected to the target debug core
410

Convert debug data from stream data to memory mapped data
412

Provide debug data to the host system
414

FIG. 4

HIGH SPEED DEBUG HUB FOR DEBUGGING DESIGNS IN AN INTEGRATED CIRCUIT

TECHNICAL FIELD

This disclosure relates to integrated circuits (ICs) and, more particularly, to a high-speed debug hub for debugging designs in an IC.

BACKGROUND

Different varieties of integrated circuits (ICs) may be debugged by coupling the IC to a host system such as a computer. Often, the IC is connected to the host system by way of a low speed interface such as a Joint Test Action Group (JTAG) interface. In general, JTAG supports boundary scan technology to serially shift data into the IC. JTAG is capable of implementing boundary scan technology albeit at relatively slower data rates compared to modern standards.

Some modern ICs are capable of generating significant amounts of debug data. Debug interfaces such as JTAG are unable to provide the bandwidth that is needed to handle the large amounts of debug data exchanged between these modern ICs and the host system. The lower data rates supported by JTAG often limit the effectiveness of debugging conducted between the host system and the IC and further limit the designer's ability to debug circuit designs implemented in the IC.

SUMMARY

In one aspect, an integrated circuit (IC) includes a high-speed interface configured to communicate with a host system for debugging and a debug hub coupled to the high-speed interface. The debug hub is configured to receive a debug command from the host system as memory mapped data. The IC also includes a plurality of debug cores coupled to the debug hub. The plurality of debug cores are coupled to the debug hub by a plurality of channels. The debug hub is configured to translate the debug command to a data stream and provide the data stream to a target debug core of the plurality of debug cores based on an address specified by the debug command.

In another aspect, a debug hub disposed within an IC. The debug hub includes a transaction manager configured to receive a debug command from a host system and send debug data to the host system, a controller configured to control operation of the transaction manager and exchange of the debug command and the debug data with the host system, and a debug core interface coupled to the controller and to a plurality of debug cores. The debug core interface is configured to send the debug command to a target debug core of the plurality of debug cores as a transmit data stream. The debug core interface is further configured to receive the debug data from the target debug core as a receive data stream and convert the debug data to memory mapped data for sending to the host system.

In another aspect, a method includes receiving, within a debug hub of an IC, a debug command from a host system, wherein the debug command is received over a high-speed interface coupled to the host system and the debug hub is coupled to a plurality of debug cores of the IC through a plurality of channels. The method includes determining an address from the debug command, wherein the address corresponds to a selected debug core of a plurality of debug cores and a selected transmit channel of the plurality of channels. The selected transmit channel is connected to the selected debug core. The method also includes converting the debug command from memory mapped data to a data stream and sending the debug command to the selected debug core via the selected transmit channel.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 4 is another example method illustrating certain operative features of a debug hub.

DETAILED DESCRIPTION

Figure 1:
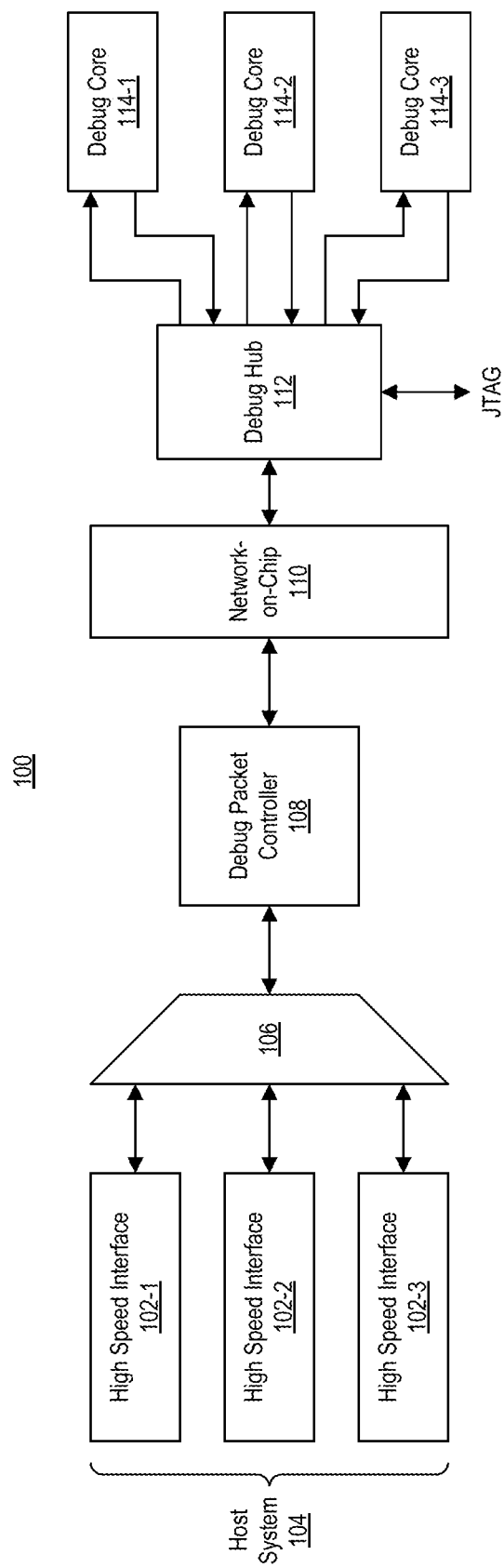
FIG. 1 illustrates an example of an integrated circuit (IC) including a debug hub.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to a high-speed debug hub for debugging designs in an IC. In accordance with the inventive arrangements described within this disclosure, a debug hub may be included in an IC. The debug hub is capable of providing data rates that are significantly higher than those provided by conventional debug interfaces such as a Joint Test Action Group (JTAG) interface. In some example implementations described herein, the debug hub is capable of supporting data transfer rates in the gigabit per second (Gbit/s) range.

The debug hub, as implemented in an IC, may be accessed by a host system through one or more different interfaces available on the IC. The debug hub may be coupled to one or more different debug cores implemented in the IC for purposes of debugging a circuit design, e.g., a user circuit design, that includes and/or uses such debug cores. In general, the debug hub is capable of receiving commands from the host system and directing the commands to appropriate ones of the debug cores coupled thereto. The debug hub is further capable of receiving debug data from the debug core(s) in response to the provided command(s) and providing the debug data back to the host system by way of data paths within the IC.

The debug hub is capable of supporting operation of a plurality of different debug cores and conveying debug commands to the debug cores at higher data rates than conventional debugging interfaces. The debug cores are capable of generating a significant amount of debug data. As such, the debug hub is capable of conveying the debug data from the debug cores to the host system at higher data rates than conventional debugging interfaces.

In one or more example implementations, the debug hub is capable of communicating with the host system by way of memory mapped transactions. The debug hub is capable of communicating with the one or more debug cores using data streams (e.g., point-to-point stream connections). As such, the debug hub is capable of converting memory mapped data (e.g., memory mapped transactions) to data streams and converting data streams to memory mapped data.

In one or more other example implementations, the debug hub may include one or more control interfaces. The control interfaces are capable of coupling with control registers of the one or more debug cores coupled to the debug hub. In this regard, for those debug cores that do not support receipt of commands via a stream interface, the debug hub is capable of conveying commands received from the host system via the one or more control interfaces.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example of a debugging architecture (architecture) 100. Architecture 100 may be implemented in an IC. Architecture 100 is capable of providing high-speed data paths linking the IC to a host system for purposes of debugging circuitry (e.g., user circuit designs implemented in the IC) from the host system. In many modern ICs, e.g., a single package, the circuitry contained therein is capable of generating significant amounts of debug data that may exceed the bandwidth of conventional debugging interfaces such as JTAG and the like. Architecture 100 is an example implementation where a host system is capable of interacting with the IC and various debugging cores over high-speed data paths.

In the example of FIG. 1, architecture 100 includes a plurality of high-speed interfaces 102 (e.g., shown as 102-1, 102-2, and 102-3). Architecture 100 may include fewer or more high-speed interfaces 102 than illustrated in FIG. 1. Examples of high-speed interfaces 102 may include, but are not limited to, a high-speed serial interface and a high-speed communication bus interface. Each of high-speed interfaces 102-1, 102-2, and 102-3 may be implemented as a different type of interface.

An example of a high-speed serial interface is the Aurora 64B/66B interface (Aurora interface) available from Xilinx, Inc. of San Jose, Calif. The Aurora interface is capable of providing high-speed serial communication. An example of a communication bus interface is a Peripheral Component Interconnect Express (PCIe) interface. The PCIe interface may include a direct memory access (DMA) circuit.

In another aspect, one of high-speed interfaces 102 may be implemented as a TAP controller and/or interface. The TAP controller implemented in architecture 100 may be implemented using a higher clock rate than other conventional JTAG interfaces.

High-speed interfaces 102 are capable of establishing communication links with a host system 104. An example of a host system 104 is described in connection with FIG. 5 (e.g., host system 502). For example, via a selected high-speed interface 102, architecture 100 may receive debug commands from host system 104. The debug commands may be write commands that cause debug hub 112 to provide data to different ones of debug cores 114 and/or configure aspects of debug hub 112. The debug commands may also be read commands that initiate retrieval of debug data by debug hub 112 from different ones of debug cores 114. The debug data generated by different ones of debug cores 114 may be provided to host system 104 over the selected high-speed interface 102.

High-speed interfaces 102 are coupled to a switch 106. In one example implementation, each high-speed interface 102 includes a stream interface that couples to a corresponding stream interface of switch 106 allowing the exchange of data between high-speed interfaces 102 and switch 106 by way of a data streams. For example, data conveyed to a high-speed interface 102 may be converted to a data stream and conveyed to switch 106. Similarly, data from switch 106 may be conveyed to high-speed interfaces 102 as data streams. Advanced Microcontroller Bus Architecture (AMBA) eXtensible Interface (hereafter "AXI") provides a stream interface (e.g., AXIS) and a memory mapped interface (e.g., AXI-MM). An AXI interface, whether a stream interface or a memory mapped interface, may be used in establishing connections between compliant circuit blocks and/or systems.

Aurora interfaces, PCIe interfaces, and AXI interfaces are provided as illustrative examples of high-speed interfaces and on-chip interfaces that may be used with the inventive arrangements described within this disclosure. The example interfaces provided are not intended as limitations. It should be appreciated that other similar and/or equivalent interfaces and/or protocols may be used in lieu of those described. As such, the various example circuit blocks and/or signals provided within this disclosure will vary based on the particular interfaces and/or protocols that are used.

Switch 106 is also coupled to a debug packet controller (DPC) 108. Switch 106 is capable of communicatively linking a selected one of high-speed interfaces 102 to DPC 108 at a time to facilitate two-way communication between the selected high-speed interface 102 and DPC 108. For example, switch 106 may be implemented as a multiplexer and demultiplexer.

In the example of FIG. 1, DPC 108 is coupled to a Network-on-Chip (NoC) 110. DPC 108 is capable of operating as an interface between switch 106 and NoC 110. For example, DPC 108 is capable of receiving data, e.g., debug commands, from the selected high-speed interface 102 via switch 106, performing any necessary format conversion, and providing the data to NoC 110. DPC 108, for example, is capable of converting received data streams from switch 106 to memory mapped data (e.g., generating memory mapped transactions), and providing the memory mapped data to NoC 110. DPC 108 is also capable of receiving data, e.g., debug data generated by debug cores 114, from NoC 110, performing any necessary format conversion, and providing the data to switch 106. For example, DPC 108 is capable of converting memory mapped debug data from NoC 110 to data streams to be provided to switch 106.

NoC 110 is a programmable interconnecting network for sharing data between endpoint circuits in the IC in which architecture 100 is implemented. The endpoint circuits may be hardwired circuit blocks and/or circuit blocks implemented using programmable logic. NoC 110 can include high-speed data paths with dedicated switching. In an example, NoC 110 includes one or more horizontal paths, one or more vertical paths, or both horizontal and vertical path(s).

Debug hub 112 is coupled to NoC 110 and to a plurality of debug cores 114. Debug hub 112 is capable of receiving debug commands from host system 104 and directing the debug commands to particular ones of debug cores 114. Each debug command, for example, may include an address that is mapped onto one of debug cores 114-1, 114-2, or 114-3. Debug hub 112 further is capable of receiving debug data from debug cores 114 and providing the debug data received from the debug cores 114 back to host system 104.

Debug hub 112 is capable of presenting itself, or appearing as, an embedded Intellectual Property (IP or circuit block) that enables host system 104 to access debug data (e.g., which may include trace data) via NoC 110. Debug hub 112 is capable of receiving the debug commands as memory mapped data (e.g., memory mapped transactions) from NoC 110. In an example implementation, NoC 110 couples to debug hub 112 via a 512-bit wide interface. Debug hub 112 is capable of converting the debug commands, received as memory mapped data from NoC 110, to data streams. Debug hub 112 is coupled to debug cores 114 via a plurality of channels. In one aspect, debug hub 112 is coupled to each debug core 114 through a transmit channel and a receive channel, where each channel is configured to convey a data stream. Debug hub 112 is capable of converting debug data from debug cores 114 into memory mapped data and providing the debug data to NoC 110 and on to host system 104.

For example, debug hub 112 is capable of accepting a debug command as a burst transfer from host system 104 over a high-speed link and decoding the debug command in the received burst. Debug hub 112 is further capable of routing the debug command to a selected debug core 114, specified in the debug command and coupled to debug hub 112. Though only three debug cores 114 are illustrated in FIG. 1, debug hub 112 may be connected to more or fewer debug cores 114. Using the AXI protocol as an example, debug hub 112 is capable of routing the debug commands to a selected debug core 114 by decoding the incoming the AXI AWADDR and ARADDR address bits from the debug command.

While debug hub 112 facilitates use of high-speed data transfers for purposes of debugging (e.g., conveying debug commands to debug cores 114 and conveying debug data from debug cores 114 to host system 104), debug hub 112 may also include a channel or interface that may be coupled to a JTAG interface to be described in greater detail in connection with FIG. 2.

Debug cores 114 may be implemented as any of a variety of different circuit blocks capable of responding to debug commands and providing debug data in response to the debug commands. Examples of debug cores 114 may include, but are not limited to, an integrated logic analyzer, a virtual input/output circuit block, a debug processor (e.g., a circuit capable of executing program code/instructions), and a memory controller. A virtual input/output circuit block refers to a circuit block that is capable of detecting activity on a particular signal (e.g., an external signal coupled to the IC), reading input port(s) of the IC (e.g., reading signals received by the IC from sources external to the IC), or asserting a logic high or low on an output port of the IC (e.g., generating a signal output from the IC to an external recipient).

In one aspect, debug cores 114 may be implemented as soft circuit blocks. Soft circuit blocks refer to circuit blocks implemented using programmable logic. In another aspect, debug cores 114 may be implemented as hardwired circuit blocks having a soft (e.g., programmable logic) wrapper capable of extracting debug data from the hardwired circuit blocks. In still another aspect, debug cores 114 may be implemented as a combination or mix of soft circuit blocks and hardwired circuit blocks.

In the example of FIG. 1, each of debug cores 114 may include a stream interface for communicating over the transmit channel and the receive channel. As an illustrative and non-limiting example, each debug core 114 may include an AXI stream interface. In an example implementation, the interface may be 32-bits in width for each of the transmit and receive channels. As noted, AXI is provided for purposes of illustration and not limitation.

Figure 2:
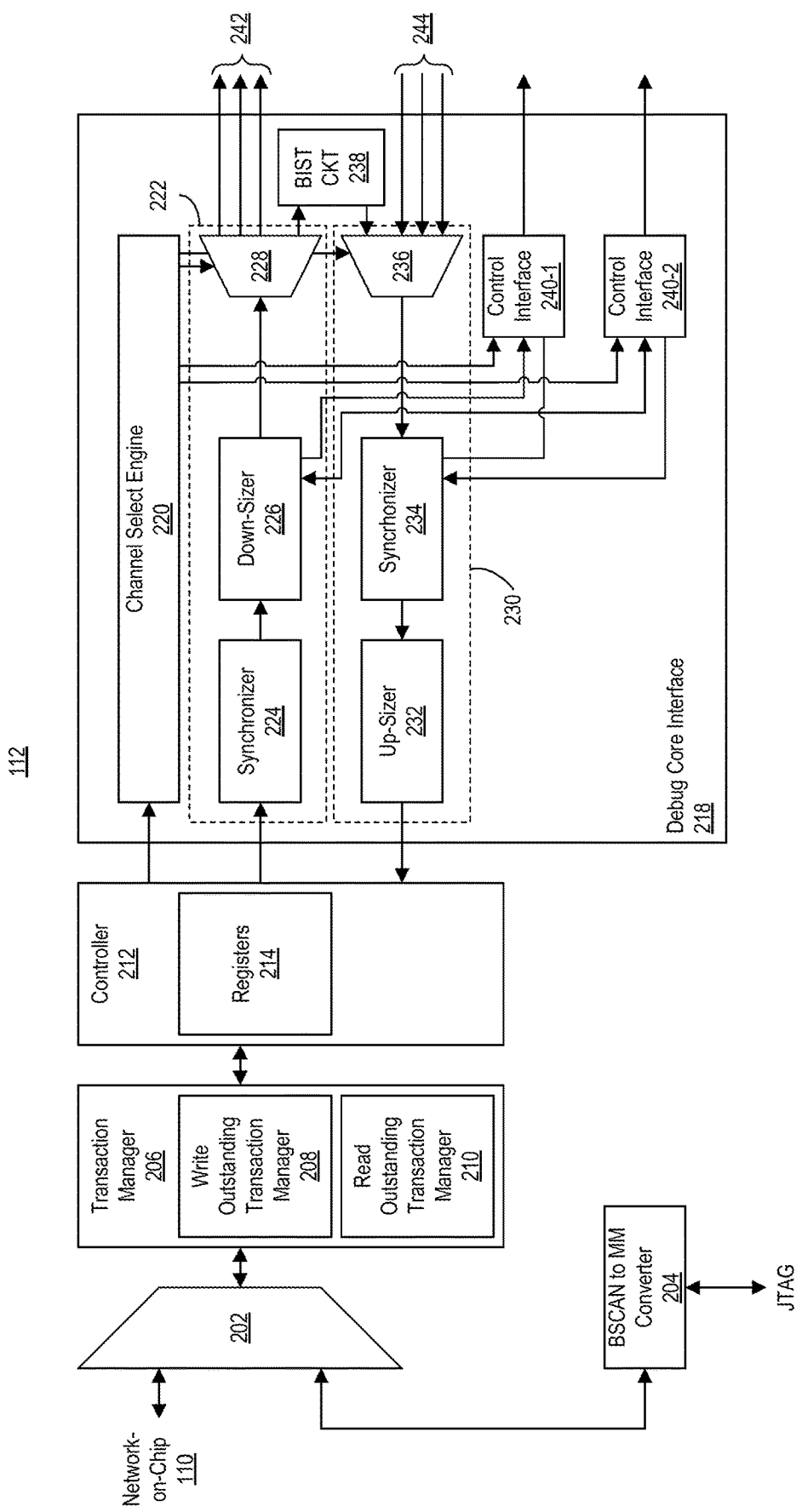
FIG. 2 illustrates an example of implementation of a debug hub.

FIG. 2 illustrates an example implementation of debug hub 112 of FIG. 1. In one aspect, debug hub 112 may be implemented as a soft circuit block, e.g., in programmable logic. In the example of FIG. 2, debug hub 112 includes a switch 202, a transaction manager 206, a controller 212, and a debug core interface 218.

Switch 202 is coupled to NoC 110 and may also be coupled to a BSCAN to memory mapped (MM) converter 204. Switch 202 is configured to couple either NoC 110 to transaction manager 206 or BSCAN to MM converter 204 to transaction manager 206. Each circuit coupled to transaction manager 206 via switch 202 is configured to operate as a master capable of driving transactions (e.g., AXI memory mapped transactions) to debug cores 114 if selected. A user specified parameter may be used to set switch 202 to select a particular master circuit thereby determining which master circuit is capable of communicating with debug cores 114.

BSCAN to MM converter 204 is capable of coupling to a JTAG interface and converting JTAG operations into memory mapped data that may be processed by debug hub 112. BSCAN to MM converter 204 is capable of operating as an on-chip master capable of issuing transactions to debug cores 114. In cases, for example, where high-speed interfaces for the IC may not be available for purposes of debugging, host system 104 still may access the functionality of debug hub 112 to access the plurality of different debug cores 114 by way of JTAG albeit at reduced data rates.

Transaction manager 206 is capable of receiving debug commands from host system 104 via switch 202 and sending debug data to host system 104 via switch 202. Transaction manager 206 is capable of receiving debug commands even in cases where the target debug core 114 is in a state rending the target debug core incapable of accepting new debug commands. Transaction manager 206 includes a write outstanding transaction manager 208 capable of queueing and/or tracking write transactions (e.g., debug commands) sent from host system 104. Transaction manager 206 may also include a read outstanding transaction manager 210 capable of queueing and/or tracking read transactions (e.g., debug commands) to retrieve debug data from debug cores 114.

In one example, each of the write and read outstanding transaction managers 208, 210 is capable of accepting up to 16 burst transactions of 64 beats over a 512-bit data bus (e.g., with NoC 110). In response to determining that the target debug core 114 is ready to accept a new debug command, transaction manager 206 pushes a debug command from the appropriate outstanding transaction manager towards the target debug core 114. As such, host system 104 need not wait for the particular target debug core 114 to which a debug command is directed to be ready before sending the debug command.

In one aspect, controller 212 is capable of implementing one or more state machines. Core controller 212, using the state machines (e.g., a receive state machine and a transmit state machine), is capable of providing handshake signaling to transaction manager 206 and control signals to debug core interface 218 to transmit debug commands to debug cores 114 and to receive debug data from debug cores 114. In one aspect, controller 212 is capable of determining the debug core 114 to which a received debug command is to be sent, e.g., the "target debug core," based on the address specified in the received debug command.

In the example of FIG. 2, controller 212 includes registers 214. Registers 214 may include control registers and data registers. In one aspect, rather than include one complete set of registers for each debug core 114, one set of physical registers 214 are included in controller 212 that are used and/or shared using virtual addressing by each of debug cores 114. As noted, controller 212 is capable of determining the target debug core 114, whether for a read or a write operation, based on the address specified in the debug commands (e.g., read and/or write requests from host system 104).

Examples of control registers included in registers 214 may include one or more status registers capable of storing information for debug cores 114 such as a clock lost status and debug core operational status for a particular debug core 114. Further examples of control registers may include, but are not limited to, a current debug core write address register configured to store the address of the target debug core to which data is to be written, a current debug core read address register configured to store the address of the target debug core from which data is to be read or received, a core type register configured to store information specifying the type of the target core (e.g., memory controller, integrated logic analyzer, etc.), a core control register configured to store information such as a soft-reset where writing to the core control register resets the internal state machines (e.g., the receive and transmit state machines), a core status register configured to store a current status of the current core (e.g., a status of previous transactions, a status of clocks, and a status of the debug cores connected such as busy, write error, read error, or the like), a version register indicating a particular version (e.g., model) of the debug core, and a Universally Unique Identifier (UUID) register.

Host system 104 is capable of writing the data to be written to the target debug core 114 by writing to the particular write data register(s) of registers 214 mapped to the target debug core 114. In one aspect, the write data registers for the target debug core 114 are capable of accepting 4 k bytes of data per write transfer. Each set of logical registers corresponding to a particular debug core 114 has a unique virtual address mapped to the respective debug core thereby allowing the logical registers to utilize the same set of physical registers 214.

In one aspect, the address space of each debug core 114 is 4 KB. This allocates 12-bits of addresses to each debug core 114. Debug hub 112 is capable of decoding higher order address bits in received data (e.g., bits 21:13 of the address channel such as AWADDR or ARADDR) to identify the target debug core 114. While debug hub 112 is executing a transaction/command with a particular debug core 114, debug hub 112 is capable of queuing up to 8 outstanding transactions (e.g., write and read) for each debug core. The queueing capability increases throughput of debug hub 112. Since debug hub 112 is capable of handling read and write transactions independently, debug hub 112 is capable of addressing both write and read commands simultaneously thereby allowing debug hub 112 to intermingle write and read transfers.

Host system 104 is capable of reading data from the target debug core 114 by reading from the particular read data register(s) of registers 214 mapped to the target debug core 114. In one aspect, the read data registers of the target debug core 114 are capable of supporting 4 k bytes of data being read back per read transfer. Each set of logical registers corresponding to a particular debug core 114 has a unique virtual address mapped to the respective core thereby allowing the logical registers to utilize the same set of physical registers.

Debug core interface 218 includes a channel select engine 220, a transmit engine 222, a receive engine 230, a built-in-self-test (BIST) circuit 238, and optionally one or more control interfaces 240 (e.g., shown as 240-1 and 240-2). In the example of FIG. 2, channel select engine 220 is coupled to controller 212 and capable of receiving control signals therefrom. For example, channel select engine 220 is capable of receiving control signals from the control registers of registers 214. In one aspect, the control signals are used by channel select engine 220 to select the particular transmit channel 242 over which transmit engine 222 transmits debug commands and/or to select the particular receive channel 244 over which receive engine 230 receives debug data from debug cores 114.

Transmit engine 222 is capable of sending the debug commands to the target debug core 114. Transmit engine 222, for example, is capable of obtaining the debug command to be provided to the target debug core 114 from the write register(s) of registers 214. Transmit engine 222 may include a synchronizer 224, a down-sizer 226, and a switch 228. Synchronizer 224 is capable of obtaining the debug command to be sent from registers 214 and synchronizing signals across clock domain boundaries between debug hub 112 and debug cores 114. Synchronizer 224 provides the debug command to down-sizer 226. Down-sizer 226 is capable of downsizing the debug command from a width corresponding to the memory mapped data to a width corresponding to the data stream to be sent over the selected transmit channel (e.g., down to the TDATA width of an AXI stream). For example, down-sizer 226 may downsize the data from 512-bits in width for the memory mapped data to 8-bits in width for the transmit channel.

In one aspect, the debug command may include a field referred to as the byte length field (BYTE_LEN). The byte length field may be specified within the header of the debug command by the host system 104 and indicate an amount of data of the debug command that is to be conveyed to the target debug core 114. An example of a packet header for a debug command is shown in Example 1 below illustrating bit locations and the corresponding description of the content specified by the bits.

| Example 1 | |
|---|---|
| Bits 31-30 | Read/Write Operation |
| Bits 29:20 | Application-Specific Usage |
| Bits 19:14 | Command or Opcode |
| Bits 13:0 | Byte Length |

For example, while the memory mapped data may support a bit width of 512-bits (64 bytes), host system 104 may only intend on sending 4 bytes of data to the target debug core 114. In that case, 60 bytes of data are to be discarded. The byte length field, which may be the 14 least significant bits of the of the packet header of the debug command, specifies the number of bytes in the burst, e.g., 4 bytes in this example, that are to be sent to the target debug core 114. Down-sizer 226 is capable of discarding the unused bytes based on the value specified in the byte length field. Continuing with the prior example where the byte length field specifies a value of 4, down-sizer 226 discards the 60 bytes that are not used thereby sending only the 4 bytes of data over the transmit channel to the target debug core 114.

In the example of FIG. 2, down-sizer 226 generates a data stream, e.g., converts the memory mapped data to a data stream. Down-sizer 226 is coupled to switch 228. Down-sizer 226 sends the debug command, as the data stream, to switch 228. Switch 228 sends the debug command to the target debug core over one of transmit channels 242 as selected by channel select engine 220. Channel select engine 220 selects the particular transmit channel 242 that is connected to the target debug core 114.

Receive engine 230 is capable of capturing or receiving debug data from a target debug core 114 in response to receiving a read request type of debug command from host system 104. Receive engine 230 is capable of sending the captured data back to host system 104 by, at least in part, writing the debug data to the read register(s) of registers 214. Receive engine 230 may include an up-sizer 232, a synchronizer 234, and a switch 236.

Switch 236 receives debug data from the target debug core 114 via a selected one of receive channels 244. Channel select engine 220 is capable of selecting the particular receive channel connected to the target debug core 114. The debug data is received as a data stream. Switch 236 provides the debug data to synchronizer 234. Synchronizer 234 is capable of synchronizing signals across clock domain boundaries between debug hub 112 and debug cores 114. Synchronizer 234 provides the debug data to up-sizer 232. Up-sizer 232 is capable of upsizing received debug data from the width corresponding to the receive channel (e.g., the TDATA width of an AXI stream) to the width corresponding to the memory mapped data. For example, if the memory mapped data is 128-bits in width, and the receive channel is 32-bits in width, up-sizer 232 must accumulate 4 sets of 32-bit data to form the 128-bit memory mapped data to write to read register(s) of registers 214.

In the example of FIG. 2, up-sizer 232 generates memory mapped data, e.g., converts the data stream to memory mapped data. In one aspect, up-sizer 232 is capable of padding the resulting memory mapped data based, at least in part, on how much debug data was requested by host system 104 in the debug command and how much debug data was provided by the target debug core 114 in response to the debug command. For example, in cases where host system 104 requested more data than was returned by the target debug core 114, up-sizer 232 is capable of adding dummy data, e.g., predetermined bit and/or bit patterns such as 0, to the debug data to provide the requested amount of debug data to host system 104 thereby avoiding an error.

As an illustrative example, consider the case where host system 104 requested 128-bits of debug data from the target debug core 114. The target debug core 114 returned only 32-bits of data and indicated that the 32-bits of data is the complete set of data to be provided back (e.g., through exercise of the TLAST signal). In that case, in response to determining that the amount of data returned by the target debug core 114 is less than the amount of debug data requested by host system 104 and that no error condition was detected, up-sizer 232 adds 96 bits of dummy data to the debug data when forming the memory mapped data. As such, host system 104 is provided with the requested amount of debug data thereby avoiding an error condition that would otherwise have occurred in view of the initial debug command and the memory mapped data protocol.

In cases where the target debug core 114 sends less than the requested amount of debug data and up-sizer 232 determines that the indication of "last data" was not received from the target debug core 114 within a predetermined amount of time of the latest portion or sample of debug data received from the target debug core 114 (e.g., detecting a time-out condition), up-sizer 232 is capable of detecting an error condition. Accordingly, up-sizer 232 is capable of setting an error flag in the appropriate control register in controller 212.

Debug core interface 218 may also include a self-test function that utilizes BIST circuit 238. In one aspect, BIST circuit 238 may be implemented as a FIFO memory having an input port coupled to switch 228 via a transmit channel 242 and an output port coupled to switch 236 via a receive channel 244. Using BIST circuit 238, debug commands from host system 104 may be looped back to host system 104.

Host system 104 is capable of invoking the self-test function to write debug commands and/or other data to BIST circuit 238 and test by using read back functionality. As such, host system 104 is capable of implementing testing operations to detect error conditions such as where a debug core is not accepting commands based on successful sending and receipt of data via BIST circuit 238 and detecting error conditions where the target debug core 114 is not responding with debug data. In another aspect, debug hub 112 is capable of testing the transmit and receive state machines contained therein by employing a near-end loop back test (e.g., where BIST circuit 238 is used under control of controller 212 for testing the state machines without sending test data to host system 104 and/or receiving test data from host system 104).

Debug core interface 218 further may include one or more control interfaces 240 that allow host system 104 to connect and/or control other types of debug cores that may not be equipped with streaming interfaces. Control interfaces 240 may operate under control of channel select engine 220. As pictured, control interface 240-1 and 240-2 each is coupled to down-sizer 226 and to synchronizer 234. In an example implementation, control interface 240-1 may be implemented as an AXI4-Lite control interface, while control interface 240-2 is implemented as an Advanced Peripheral Bus (APB) bridge. Control interfaces other than the examples described herein may be used.

Figure 3:
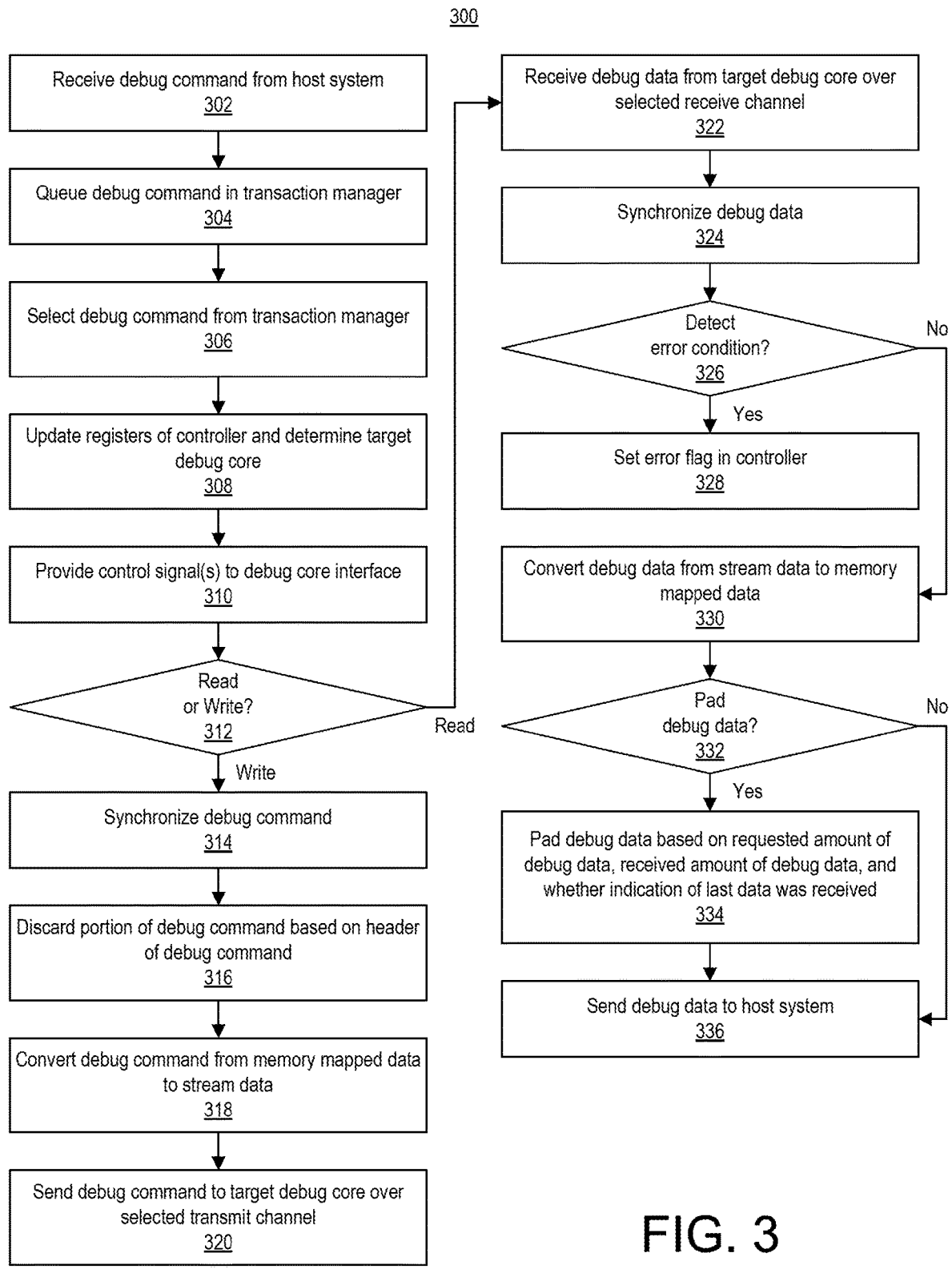
FIG. 3 is an example method illustrating certain operative features of a debug hub.

FIG. 3 is an example method 300 illustrating certain operative features of debug hub 112 as described within this disclosure. In step 302, debug hub 112 receives a debug command sent from host system 104. The debug command may specify a write operation (e.g., providing a debug command to a target debug core 114 or writing configuration data) or a read operation (retrieving debug information from a particular target debug core 114). The debug command may be received via switch 202 into transaction manager 206.

In block 304, the transaction manager 206 queues the debug command. For example, transaction manager 206 is capable of determining the type of debug command received. The transaction manager 206 further is capable queuing the received debug command in the write outstanding transaction manager 208 or the read outstanding transaction manager 210. Transaction manager 206 is capable of storing received debug commands temporarily until the target debug core referenced by the debug command is available to perform the operation specified by the debug command (e.g., read or write).

In block 306, the controller 212 selects a debug command from the transaction manager 206. In one aspect, the controller 212 selects a debug command from transaction manager 206 based, at least in part, upon availability of the target debug core 114 of the selected debug command. In block 308, the controller 212 updates the registers 214 contained therein. For example, controller 212 writes the debug command to the appropriate control registers and data (read or write) registers of registers 214. In block 310, controller 212 provides control signals to the debug core interface 218. More particularly, the controller 212 provides control signals to the channel select engine 220.

In block 312, for a write debug command, method 300 continues to block 314. For a read debug command, method 300 proceeds to block 322. Continuing with block 314, the transmit engine 222 is used to send the debug command to the target debug core 114. In block 314, the synchronizer 224 synchronizes the received debug command (e.g., from the write registers(s) of registers 214) with the clock domain of the target debug core. In block 314, the down-sizer 226 discards a portion of the debug command based on the byte length field in the header of the debug command. It should be appreciated that discarding a portion of the debug command is optional in the sense that in some cases the entirety of the debug command may be used and/or the byte length field may not be utilized.

In block 318, the down-sizer 226 converts the memory mapped data to a data stream. In block 320, the switch 228 sends the processed debug command, as the data stream, over a selected transmit channel 242. The particular transmit channel 242 over which the debug command is sent to the target debug core 114 is selected via the control signals provided to switch 228 from channel select engine 220.

Continuing with block 322 in the case of a read debug command, the receive engine 230 is used to read debug data from the target debug core 114. In block 322, switch 236 receives debug data from the target debug core 114 over a selected receive channel 244. The particular receive channel 244 over which the debug data is received from the target debug core 114 is selected via the control signals provided to switch 236 from channel select engine 220. In block 324, synchronizer 234 synchronizes the debug data with the clock domain corresponding to debug hub 112.

In block 326, up-sizer 232 determines whether an error condition has been detected. For example, up-sizer 232 is capable of comparing the amount of debug data provided from the target debug core 114 with the amount of debug data requested from the host system 104 from the target debug core 114. An error condition is detected by up-sizer 232 in response to determining that the amount of debug data received from the target debug core 114 is less than the amount of data requested from the target debug core 114 by host system 104 and that the target debug core 114 did not provide an indication of last data within a predetermined time of sending a last portion (e.g., sample) of the debug data. In response to detecting an error condition, method 300 continues to block 328. In block 328, up-sizer 232 sets an error flag within controller 212. The error flag, for example, may be one of registers 214 or a particular bit in one of registers 214 of controller 212. In response to determining that no error condition was detected, method 300 continues to block 330.

Continuing with block 330, up-sizer 232 converts the debug data from a data stream to memory mapped data. In block 332, up-sizer 232 determines whether the received debug data requires padding. In response to determining that the received debug data requires padding, method 300 continues to block 334. In block 334, up-sizer 232 pads the debug data based on the comparison of the amount of debug data received from the target debug core 114 with the amount of debug data requested from the target debug core 114 by host system 104. For example, up-sizer 232 adds dummy data to the debug data so that the total amount of debug data including the added dummy data is equivalent to the amount of debug data requested from the target debug core by the host system 104. In block 336, up-sizer 232 sends the debug data to the host system 104. For example, up-sizer 232 forwards the debug data to controller 212 (e.g., to read register(s) of registers 214) and on through transaction manager 206 and switch 202 to host system 104.

FIG. 4 illustrates another example method 400 illustrating certain operative features of debug hub 112. As discussed, debug hub 112 is implemented within an IC along with a plurality of different debug cores 114 to which debug hub 112 is coupled. Further, the IC and, as such, debug hub 112, is coupled to host system 104 via a high-speed interface 102. Accordingly, in step 402, the debug hub 112 receives a debug command from host system 104 via the high-speed interface.

In block 404, the debug hub 112 determines an address from the debug command. The address corresponds to a target debug core 114 of the plurality of debug cores. Further, since each debug core 114 is coupled to debug hub 112 through a particular send and receive channels 242, 244, the address also specifies the particular channel to be used to send the debug command to the target debug core 114.

In block 406, the transmit engine 222 of debug hub 112 converts the debug command from memory mapped data to a data stream. As noted, the transmit engine 222 may also discard a portion of the debug command based upon a byte length field included in the header of the debug command. In block 408, the transmit engine 222 is capable of sending the debug command to the target debug core over a first selected channel (e.g., the transmit channel of the target debug core 114).

In block 410, debug hub 112 is capable of receiving debug data from the target debug core 114 over a second selected channel (e.g., the receive channel) connected to the target debug core 114. As discussed, the receive engine 230 is capable of reading debug data provided from the selected debug core 114. The debug data may be read, e.g., received, in response to a read type of debug command received from host system 104.

In block 412, the receive engine 230 is capable of converting the debug data from a data stream to memory mapped data. In one aspect, the receive engine 230 is capable of padding the debug data in cases where no error condition is detected and the amount of debug data provided from the target debug core 114 is less than the amount of debug data requested from the selected debug core 114 by the host system 104. In block 414, the debug data is provided to the host system 104. For example, the receive engine is capable of providing the debug data to the controller 212. The debug data may be passed from the controller 212 to the transaction manager 206 and output from debug hub 112 via switch 202.

Figure 5:
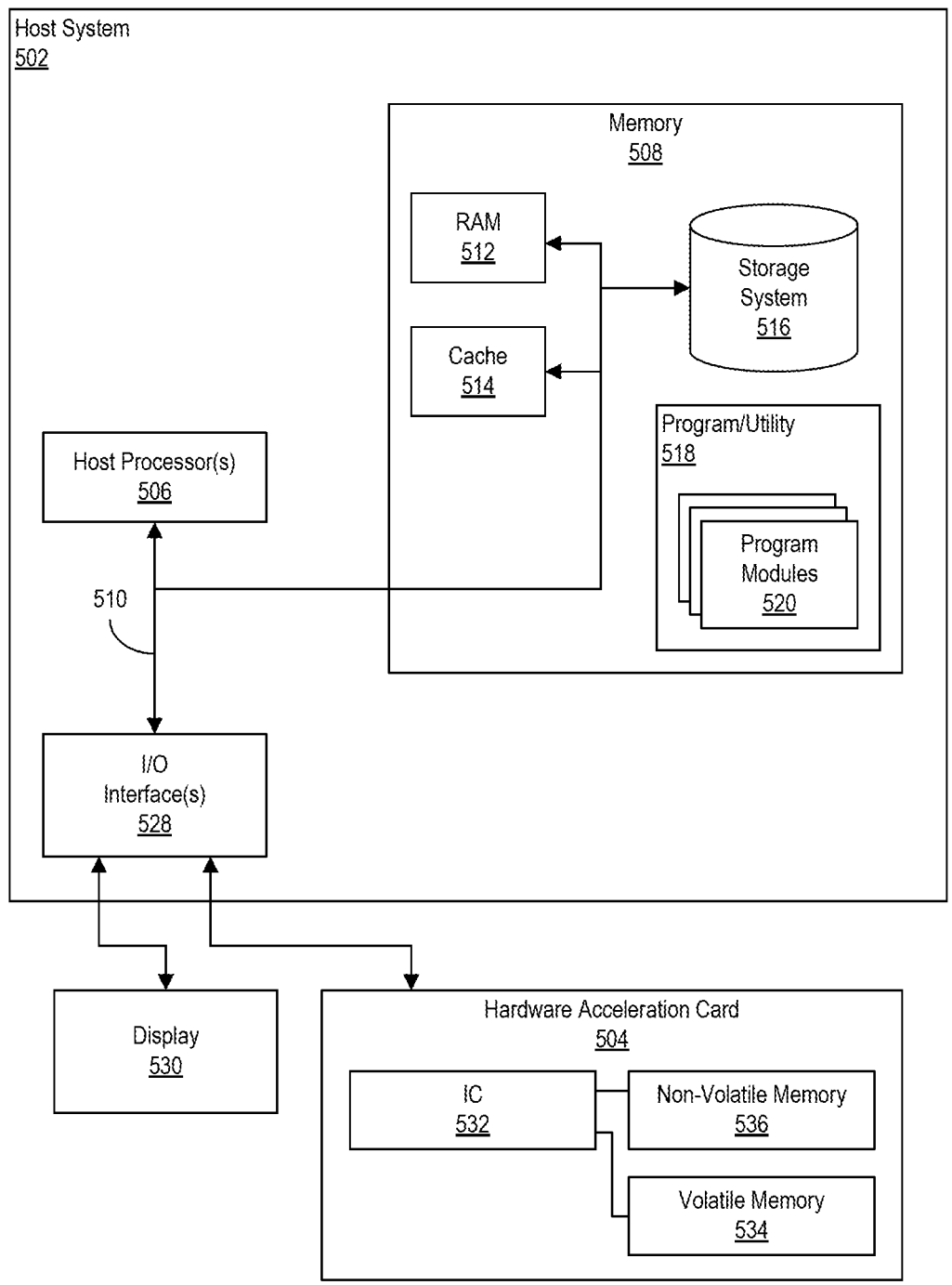
FIG. 5 illustrates an example of a host system coupled to an IC having a debug hub.

FIG. 5 illustrates an example of a host system 502 coupled to an IC 532 having a debug hub. Host system 502 is an example implementation of host system 104 as described within this disclosure. IC 532 may implement and/or include debug hub 112 and a plurality of debug cores 114 as described within this disclosure.

Host system 502 may include one or more processors 506 (e.g., central processing units or circuits capable of executing program code/instructions), a memory 508, and a bus 510 that couples various system components including memory 508 to processor(s) 506. Processor(s) 506 may include any of a variety of processors that are capable of executing program code. Example processor types include, but are not limited to, processors having an x86 type of architecture (IA-32, IA-64, etc.), Power Architecture, ARM processors, and the like.

Bus 510 represents one or more of any of several types of communication bus structures, including a memory bus or memory controller, a peripheral bus, an accelerated graphics port, and a processor or local bus using any of a variety of available bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, and PCI Express (PCIe) bus.

Host system 502 typically includes a variety of computer readable media. Such media may be any available media that is accessible by host system 502 and may include any combination of volatile media, non-volatile media, removable media, and/or non-removable media.

Memory 508 may include computer readable media in the form of volatile memory, such as random-access memory (RAM) 512 and/or cache memory 514. Host system 502 may also include other removable/non-removable, volatile/non-volatile computer system storage media. By way of example, storage system 516 may be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each may be connected to bus 510 by one or more data media interfaces. As will be further depicted and described below, memory 508 may include at least one computer program product having a set (e.g., at least one) of program modules (e.g., program code) that are configured to carry out the functions and/or operations described within this disclosure.

For example, program/utility 518, having a set (at least one) of program modules 520 which may include, but are not limited to, an operating system, one or more application programs (e.g., user applications), other program modules, and/or program data, is stored in memory 508. Program modules 520 generally carry out the functions and/or methodologies as described herein at least with respect to operations performed by host system 502. For example, program modules 520 may implement a software stack. The software stack may implement a runtime environment capable of performing operations attributable to host system 502 as described within this disclosure. In one aspect, program modules 520 includes a driver or daemon capable of communicating with IC 532.

Program/utility 518 is executable by processor(s) 506. Program/utility 518 and any data items used, generated, and/or operated upon by processor(s) 506 are functional data structures that impart functionality when employed by processor(s) 506. As defined within this disclosure, a "data structure" is a physical implementation of a data model's organization of data within a physical memory. As such, a data structure is formed of specific electrical or magnetic structural elements in a memory. A data structure imposes physical organization on the data stored in the memory as used by an application program executed using a processor.

Host system 502 may include one or more Input/Output (I/O) interfaces 528 communicatively linked to bus 510. I/O interface(s) 528 allow host system 502 to communicate with external devices, couple to external devices that allow user(s) to interact with host system 502, couple to external devices that allow host system 502 to communicate with other computing devices, and the like. For example, host system 502 may be communicatively linked to a display 530 and to a hardware acceleration card 504 through I/O interface(s) 528. Host system 502 may be coupled to other external devices such as a keyboard (not shown) via I/O interface(s) 528. Examples of I/O interfaces 528 may include, but are not limited to, network cards, modems, network adapters, hardware controllers, etc.

In an example implementation, the I/O interface 528 through which host system 502 communicates with hardware acceleration card 504 is a PCIe adapter. Hardware acceleration card 504 may be implemented as a circuit board that couples to host system 502. Hardware acceleration card 504 may, for example, be inserted into a card slot, e.g., an available bus and/or PCIe slot, of host system 502.

Hardware acceleration card 504 includes IC 532. Hardware acceleration card 504 also includes volatile memory 534 coupled to IC 532 and may include a non-volatile memory 536 also coupled to IC 532. Volatile memory 534 may be implemented as a RAM that is external to IC 532, but is still considered a "local memory" of IC 532, whereas memory 508, being within host system 502, is not considered local to IC 532. Non-volatile memory 536 may be implemented as flash memory. Non-volatile memory 536 is also external to IC 532 and may be considered local to programmable IC 532.

FIG. 5 is not intended to suggest any limitation as to the scope of use or functionality of the examples described herein. Host system 502 is an example of computer hardware (e.g., a system) that is capable of performing the various operations described within this disclosure and/or relating to hardware acceleration card 504 and/or IC 532.

Host system 502 is only one example implementation of a computer that may be used with a hardware acceleration card. Host system 502 is shown in the form of a computing device, e.g., a computer or server. Host system 502 can be practiced as a standalone device, as a bare metal server, in a cluster, or in a distributed cloud computing environment. In a distributed cloud computing environment, tasks are performed by remote processing devices that are linked through a communications network. In a distributed cloud computing environment, program modules may be located in both local and remote computer system storage media including memory storage devices.

As used herein, the term "cloud computing" refers to a computing model that facilitates convenient, on-demand network access to a shared pool of configurable computing resources such as networks, servers, storage, applications, ICs (e.g., programmable ICs) and/or services. These computing resources may be rapidly provisioned and released with minimal management effort or service provider interaction. Cloud computing promotes availability and may be characterized by on-demand self-service, broad network access, resource pooling, rapid elasticity, and measured service.

Some computing environments, e.g., cloud computing environments and/or edge computing environments using host system 502 or other suitable data processing system, generally support the FPGA-as-a-Service (FaaS) model. In the FaaS model, user functions are hardware accelerated as circuit designs implemented within programmable ICs operating under control of the (host) data processing systems. Other examples of cloud computing models are described in the National Institute of Standards and Technology (NIST) and, more particularly, the Information Technology Laboratory of NIST.

Host system 502 is operational with numerous other general-purpose or special-purpose computing system environments or configurations. Examples of computing systems, environments, and/or configurations that may be suitable for use with host system 502 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Figure 6:
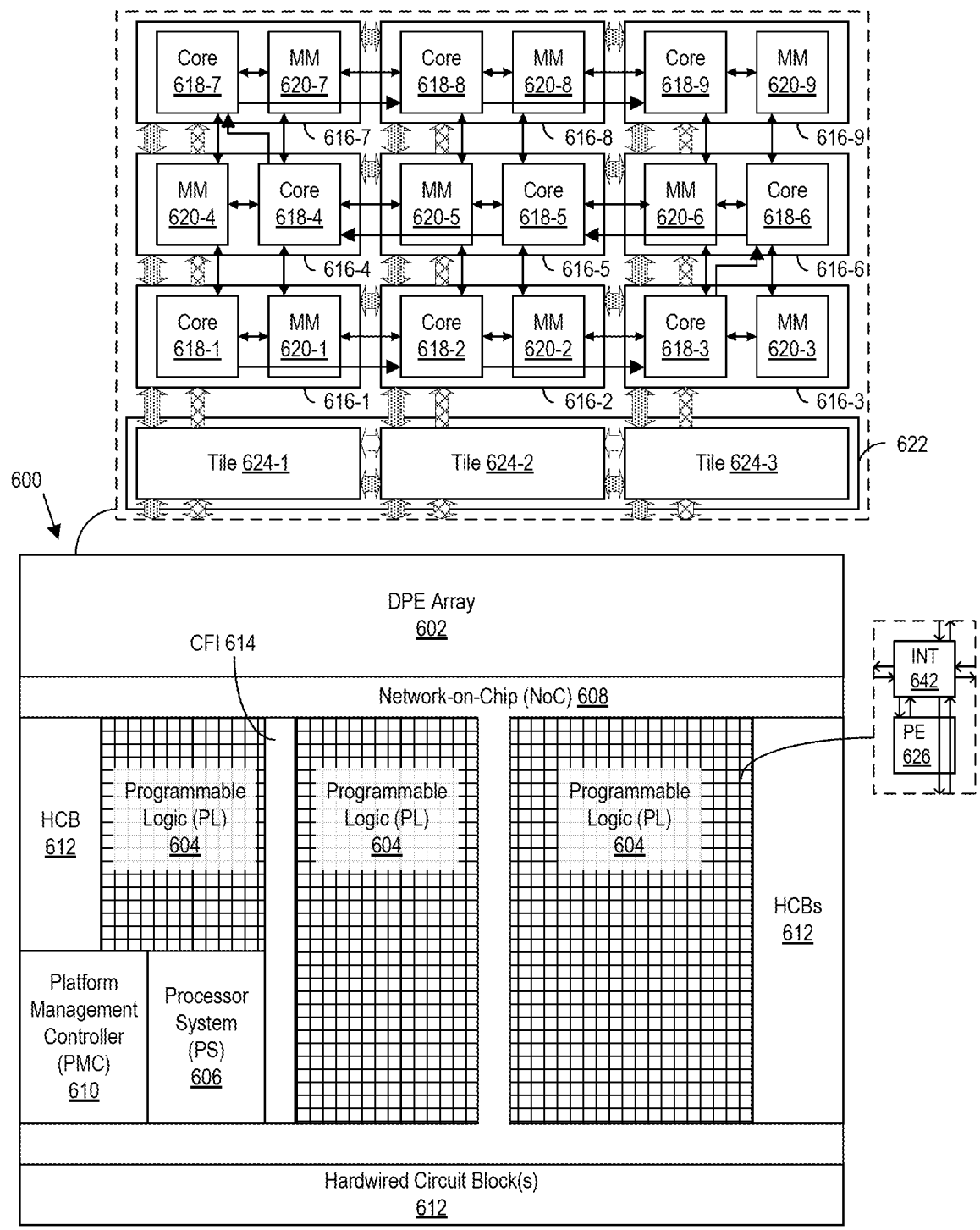
FIG. 6 illustrates an example architecture for an IC in which the debug hub may be implemented.

FIG. 6 illustrates an example architecture of an IC 600 in which a debug hub may be implemented. IC 600 is an example of a programmable IC and an adaptive system. In one aspect, IC 600 is also an example of a System-on-Chip (SoC). In the example of FIG. 6, IC 600 is implemented on a single die provided within a single integrated package. In other examples, IC 600 may be implemented using a plurality of interconnected dies where the various programmable circuit resources illustrated in FIG. 6 are implemented across the different interconnected dies.

In the example, IC 600 includes a data processing engine (DPE) array 602, programmable logic (PL) 604, a processor system (PS) 606, a NoC 608, a platform management controller (PMC) 610, and one or more hardwired circuit blocks 612. A configuration frame interface (CFI) 614 is also included.

DPE array 602 is implemented as a plurality of interconnected and programmable data processing engines (DPEs) 616. DPEs 616 may be arranged in an array and are hardwired. Each DPE 616 can include one or more cores 618 and a memory module (abbreviated "MM" in FIG. 6) 620. In one aspect, each core 618 is capable of executing program code stored in a core-specific program memory contained within each respective core (not shown). Each core 618 is capable of directly accessing the memory module 620 within the same DPE 616 and the memory module 620 of any other DPE 616 that is adjacent to the core 618 of the DPE 616 in the up, down, left, and right directions. For example, core 618-5 is capable of directly reading and/or writing (e.g., via respective memory interfaces not shown) memory modules 620-5, 620-8, 620-6, and 620-2. Core 618-5 sees each of memory modules 620-5, 620-8, 620-6, and 620-2 as a unified region of memory (e.g., as a part of the local memory accessible to core 618-5). This facilitates data sharing among different DPEs 616 in DPE array 602. In other examples, core 618-5 may be directly connected to memory modules 620 in other DPEs.

DPEs 616 are interconnected by programmable DPE interconnect circuitry. The programmable DPE interconnect circuitry may include one or more different and independent networks. For example, the programmable DPE interconnect circuitry may include a streaming network formed of streaming connections (shaded arrows), a memory mapped network formed of memory mapped connections (cross-hatched arrows).

Loading configuration data into control registers of DPEs 616 by way of the memory mapped connections allows each DPE 616 and the components therein to be controlled independently. DPEs 616 may be enabled/disabled on a per-DPE basis. Each core 618, for example, may be configured to access the memory modules 620 as described or only a subset thereof to achieve isolation of a core 618 or a plurality of cores 618 operating as a cluster. Each streaming connection may be configured to establish logical connections between only selected ones of DPEs 616 to achieve isolation of a DPE 616 or a plurality of DPEs 616 operating as a cluster. Because each core 618 may be loaded with program code specific to that core 618, each DPE 616 is capable of implementing one or more different kernels therein.

In other aspects, the programmable DPE interconnect circuitry within DPE array 602 may include additional independent networks such as a debug network that is independent (e.g., distinct and separate from) the streaming connections and the memory mapped connections, and/or an event broadcast network. In some aspects, the debug network is formed of memory mapped connections and/or is part of the memory mapped network.

Cores 618 may be directly connected with adjacent cores 618 via core-to-core cascade connections. In one aspect, core-to-core cascade connections are unidirectional and direct connections between cores 618 as pictured. In another aspect, core-to-core cascade connections are bidirectional and direct connections between cores 618. In general, core-to-core cascade connections generally allow the results stored in an accumulation register of a source core to be provided directly to an input of a target or load core. Activation of core-to-core cascade interfaces may also be controlled by loading configuration data into control registers of the respective DPEs 616. In one aspect, an example of a debug core includes one or more DPEs 616.

SoC interface block 622 operates as an interface that connects DPEs 616 to other resources of IC 600. In the example of FIG. 6, SoC interface block 622 includes a plurality of interconnected tiles 624 organized in a row. In particular embodiments, different architectures may be used to implement tiles 624 within SoC interface block 622 where each different tile architecture supports communication with different resources of IC 600. Tiles 624 are connected so that data may be propagated from one tile to another bi-directionally. Each tile 624 is capable of operating as an interface for the column of DPEs 616 directly above.

Tiles 624 are connected to adjacent tiles, to DPEs 616 immediately above, and to circuitry below using the streaming connections and the memory mapped connections as shown. Tiles 624 may also include a debug network that connects to the debug network implemented in DPE array 602. Each tile 624 is capable of receiving data from another source such as PS 606, PL 604, and/or another hardwired circuit block 612. Tile 624-1, for example, is capable of providing those portions of the data, whether application or configuration, addressed to DPEs 616 in the column above to such DPEs 616 while sending data addressed to DPEs 616 in other columns on to other tiles 624, e.g., 624-2 or 624-3, so that such tiles 624 may route the data addressed to DPEs 616 in their respective columns accordingly.

In one aspect, SoC interface block 622 includes two different types of tiles 624. A first type of tile 624 has an architecture configured to serve as an interface only between DPEs 616 and PL 604. A second type of tile 624 is has an architecture configured to serve as an interface between DPEs 616 and NoC 608 and also between DPEs 616 and PL 604. SoC interface block 622 may include a combination of tiles of the first and second types or tiles of only the second type.

PL 604 is circuitry that may be programmed to perform specified functions. As an example, PL 604 may be implemented as field programmable gate array type of circuitry. PL 604 can include an array of programmable circuit blocks. As defined herein, the term "programmable logic" means circuitry used to build reconfigurable digital circuits. Programmable logic is formed of many programmable circuit blocks sometimes referred to as "tiles" that provide basic functionality. The topology of PL 604 is highly configurable unlike hardwired circuitry. Each programmable circuit block of PL 604 typically includes a programmable element 626 (e.g., a functional element) and a programmable interconnect 642. The programmable interconnects 642 provide the highly configurable topology of PL 604. The programmable interconnects 642 may be configured on a per wire basis to provide connectivity among the programmable elements 626 of programmable circuit blocks of PL 604 and is configurable on a per-bit basis (e.g., where each wire conveys a single bit of information) unlike connectivity among DPEs 616, for example.

Examples of programmable circuit blocks of PL 604 include configurable logic blocks having look-up tables and registers. Unlike hardwired circuitry described below and sometimes referred to as hard blocks, these programmable circuit blocks have an undefined function at the time of manufacture. PL 604 may include other types of programmable circuit blocks that also provide basic and defined functionality with more limited programmability. Examples of these circuit blocks may include digital signal processing blocks (DSPs), phase lock loops (PLLs), and block random access memories (BRAMs). These types of programmable circuit blocks, like others in PL 604, are numerous and intermingled with the other programmable circuit blocks of PL 604. These circuit blocks may also have an architecture that generally includes a programmable interconnect 642 and a programmable element 626 and, as such, are part of the highly configurable topology of PL 604.

Prior to use, PL 604, e.g., the programmable interconnect and the programmable elements, must be programmed or "configured" by loading data referred to as a configuration bitstream into internal configuration memory cells therein. The configuration memory cells, once loaded with a configuration bitstream, define how PL 604 is configured, e.g., the topology, and operates (e.g., particular functions performed). Within this disclosure, a "configuration bitstream" is not equivalent to program code executable by a processor or computer. As discussed, debug cores 114 may be implemented using PL 604.

PS 606 is implemented as hardwired circuitry that is fabricated as part of IC 600. PS 606 may be implemented as, or include, any of a variety of different processor types each capable of executing program code. For example, PS 606 may be implemented as an individual processor, e.g., a single core capable of executing program code. In another example, PS 606 may be implemented as a multi-core processor. In still another example, PS 606 may include one or more cores, modules, co-processors, I/O interfaces, and/or other resources. PS 606 may be implemented using any of a variety of different types of architectures. Example architectures that may be used to implement PS 606 may include, but are not limited to, an ARM processor architecture, an x86 processor architecture, a graphics processing unit (GPU) architecture, a mobile processor architecture, a DSP architecture, combinations of the foregoing architectures, or other suitable architecture that is capable of executing computer-readable instructions or program code.

NoC 608 is a programmable interconnecting network for sharing data between endpoint circuits in IC 600. In one aspect, NoC 608 is an example implementation of NoC 110 of FIG. 1. The endpoint circuits can be disposed in DPE array 602, PL 604, PS 606, and/or selected hardwired circuit blocks 612. NoC 608 can include high-speed data paths with dedicated switching. In an example, NoC 608 includes one or more horizontal paths, one or more vertical paths, or both horizontal and vertical path(s). The arrangement and number of regions shown in FIG. 6 is merely an example. NoC 608 is an example of the common infrastructure that is available within IC 600 to connect selected components and/or subsystems.

Within NoC 608, the nets that are to be routed through NoC 608 are unknown until a user circuit design is created for implementation within IC 600. NoC 608 may be programmed by loading configuration data into internal configuration registers that define how elements within NoC 608 such as switches and interfaces are configured and operate to pass data from switch to switch and among the NoC interfaces to connect the endpoint circuits. NoC 608 is fabricated as part of IC 600 (e.g., is hardwired) and, while not physically modifiable, may be programmed to establish connectivity between different master circuits and different slave circuits of a user circuit design. NoC 608, upon power-on, does not implement any data paths or routes therein. Once configured by PMC 610, however, NoC 608 implements data paths or routes between endpoint circuits.

PMC 610 is responsible for managing IC 600. PMC 610 is a subsystem within IC 600 that is capable of managing the other programmable circuit resources across the entirety of IC 600. PMC 610 is capable of maintaining a safe and secure environment, booting IC 600, and managing IC 600 during normal operations. For example, PMC 610 is capable of providing unified and programmable control over power-up, boot/configuration, security, power management, safety monitoring, debugging, and/or error handling for the different programmable circuit resources of IC 600 (e.g., DPE array 602, PL 604, PS 606, and NoC 608). PMC 610 operates as a dedicated platform manager that decouples PS 606 and from PL 604. As such, PS 606 and PL 604 may be managed, configured, and/or powered on and/or off independently of one another. In one aspect, switch 106 and DPC 108 of FIG. 1 may be included within, or implemented as part of, PMC 610.

PMC 610 may be implemented as a processor with dedicated resources. PMC 610 may include multiple redundant processors. The processors of PMC 610 are capable of executing firmware. Use of firmware supports configurability and segmentation of global features of IC 600 such as reset, clocking, and protection to provide flexibility in creating separate processing domains (which are distinct from "power domains" that may be subsystem-specific).

Processing domains may involve a mixture or combination of one or more different programmable circuit resources of IC 600 (e.g., wherein the processing domains may include different combinations or devices from DPE array 602, PS 606, PL 604, NoC 608, and/or other hardwired circuit blocks 612).

Hardwired circuit blocks 612 include special-purpose circuit blocks fabricated as part of IC 600. Though hardwired, hardwired circuit blocks 612 may be configured by loading configuration data into control registers to implement one or more different modes of operation. Examples of hardwired circuit blocks 612 may include input/output (I/O) blocks, transceivers for sending and receiving signals to circuits and/or systems external to IC 600, memory controllers, or the like. Examples of different I/O blocks may include single-ended and pseudo differential I/Os. Examples of transceivers may include high-speed differentially clocked transceivers. Other examples of hardwired circuit blocks 612 include, but are not limited to, cryptographic engines, digital-to-analog converters (DACs), analog-to-digital converters (ADCs), and the like. In general, hardwired circuit blocks 612 are application-specific circuit blocks. As noted, hardwired circuit blocks 612 may be debug cores using a soft wrapper.

CFI 614 is an interface through which configuration data, e.g., a configuration bitstream, may be provided to PL 604 to implement different user-specified circuits and/or circuitry therein. CFI 614 is coupled to and accessible by PMC 610 to provide configuration data to PL 604. In some cases, PMC 610 is capable of first configuring PS 606 such that PS 606, once configured by PMC 610, may provide configuration data to PL 604 via CFI 614. In one aspect, CFI 614 has a built in cyclic redundancy checking (CRC) circuitry (e.g., CRC 32-bit circuitry) incorporated therein. As such, any data that is loaded into CFI 614 and/or read back via CFI 614 may be checked for integrity by checking the values of codes attached to the data.

The various programmable circuit resources illustrated in FIG. 6 may be programmed initially as part of a boot process for IC 600. During runtime, the programmable circuit resources may be reconfigured. In one aspect, PMC 610 is capable of initially configuring DPE array 602, PL 604, PS 606, and NoC 608. At any point during runtime, PMC 610 may reconfigure all or a portion of IC 600. In some cases, PS 606 may configure and/or reconfigure PL 604 and/or NoC 608 once initially configured by PMC 610.

FIG. 6 is provided for purposes of illustration and not limitation. The example implementations of debug hub 112 may be included in any of a variety of different types of ICs whether field programmable gate arrays (FPGAs), ICs that include hardwired and programmable logic, or in Application Specific ICs.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random access memory (SRAM), a portable compact disc read-only memory (CD-ROM), a digital versatile disk (DVD), a memory stick, a floppy disk, or the like.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

In one aspect, an IC includes a high-speed interface configured to communicate with a host system for debugging and a debug hub coupled to the high-speed interface. The debug hub is configured to receive a debug command from the host system as memory mapped data. The IC also includes a plurality of debug cores coupled to the debug hub. The plurality of debug cores are coupled to the debug hub by a plurality of channels. The debug hub is configured to translate the debug command to a data stream and provide the data stream to a target debug core of the plurality of debug cores based on an address specified by the debug command.

In another aspect, the debug hub includes a transmit engine coupled to the plurality of debug cores, wherein the transmit engine sends the data stream to the target debug core.

In another aspect, the transmit engine is configured to translate the debug command to the data stream.

In another aspect, the transmit engine is configured to discard a portion of the debug command based on a length specified in a header of the debug command.

In another aspect, the debug hub includes a receive engine configured to receive debug data sent from the target debug core and convert the debug data to memory mapped data for sending to the host system.

In another aspect, the receive engine is configured to pad the debug data in response to determining that an amount of the debug data received from the target debug core is less than an amount of data requested by the host system and that an indication of last data is received from the target debug core within a predetermined amount of time.

In another aspect, the receive engine is configured to detect an error condition in response to determining that the target debug core provided less debug data than requested by the host system and did not provide an indication of last data being sent within a predetermined amount of time.

In another aspect, the IC includes a DPC coupled to the high-speed interface, wherein the DPC is configured to process packets of debug data. The IC also includes a NoC coupled to the DPC and to the debug hub.

In another aspect, a debug hub disposed within an IC. The debug hub includes a transaction manager configured to receive a debug command from a host system and send debug data to the host system, a controller configured to control operation of the transaction manager and exchange of the debug command and the debug data with the host system, and a debug core interface coupled to the controller and to a plurality of debug cores. The debug core interface is configured to send the debug command to a target debug core of the plurality of debug cores as a transmit data stream. The debug core interface is further configured to receive the debug data from the target debug core as a receive data stream and convert the debug data to memory mapped data for sending to the host system.

The foregoing and other implementations can each optionally include one or more of the following features, alone or in combination. Some example implementations include all the following features in combination.

In another aspect, the debug core interface includes a transmit engine having a plurality of transmit channels coupled to the plurality of debug cores. The transmit engine is configured to convert the debug command from memory mapped data to the transmit data stream and send the debug command to the target debug core via a selected transmit channel of the plurality of transmit channels coupled to the target debug core.

In another aspect, the transmit engine, in converting the debug command to the transmit data stream, is configured to discard a portion of the debug command based on a length field specified in a header of the debug command.

In another aspect, the debug core interface includes a receive engine having a plurality of receive channels coupled to the plurality of debug cores, wherein the receive engine is configured to receive the debug data as the receive data stream over a selected receive channel of the plurality of receive channels coupled to the target debug core and convert the debug data to memory mapped data.

In another aspect, the receive engine is configured to pad the debug data in response to determining that an amount of the debug data received from the target debug core is less than an amount of data requested by the host system and that an indication of last data is received from the target debug core within a predetermined amount of time.

In another aspect, the receive engine is configured to detect an error condition in response to determining that the target debug core provided less debug data than requested by the host system and did not provide an indication of last data being sent within a predetermined amount of time.

In another aspect, the debug core interface includes a BIST circuit coupled to the transmit engine and the receive engine.

In another aspect, the debug core interface includes a channel select engine configured to select the selected transmit channel and the selected receive channel to communicate with the selected core based on the debug command.

In another aspect, the debug hub includes a source selection circuit configured to selectively pass memory mapped data from a first source corresponding to a high-speed interface coupled to the host system or a second source.

In another aspect, the debug hub includes a BSCAN to memory mapped converter circuit configured to convert JTAG transactions to memory mapped data, wherein the BSCAN to memory mapped converter circuit is the second source.

In another aspect, a method includes receiving, within a debug hub of an IC, a debug command from a host system, wherein the debug command is received over a high-speed interface coupled to the host system and the debug hub is coupled to a plurality of debug cores of the IC through a plurality of channels. The method includes determining an address from the debug command, wherein the address corresponds to a selected debug core of a plurality of debug cores and a selected transmit channel of the plurality of channels. The selected transmit channel is connected to the selected debug core. The method also includes converting the debug command from memory mapped data to a data stream and sending the debug command to the selected debug core via the selected transmit channel.

The foregoing and other implementations can each optionally include one or more of the following features, alone or in combination. Some example implementations include all the following features in combination.

In another aspect, the method includes receiving debug data from the selected debug core over a receive channel connected to the selected core, wherein the receive channel is one of the plurality of channels, converting the debug data from a data stream to memory mapped data, and providing the debug data to the host system.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. An integrated circuit, comprising:
    a high-speed interface configured to communicate with a host system for debugging;
    a debug hub coupled to the high-speed interface, wherein the debug hub is configured to receive a debug command from the host system as memory mapped data; and
    a plurality of debug cores coupled to the debug hub, wherein each debug core is coupled to the debug hub by a plurality of channels;
    wherein the debug hub is configured to translate the debug command to a data stream and provide the data stream to a target debug core of the plurality of debug cores based on an address specified by the debug command; and
    wherein the debug hub comprises a receive engine configured to receive debug data sent from the target debug core and convert the debug data to memory mapped data for sending to the host system, and wherein the receive engine is configured to pad the debug data in response to determining that an amount of the debug data received from the target debug core is less than an amount of data requested by the host system and that an indication of last data is received from the target debug core within a predetermined amount of time.

2. The integrated circuit of claim 1, wherein the debug hub comprises:
a transmit engine coupled to the plurality of debug cores, wherein the transmit engine sends the data stream to the target debug core.

3. The integrated circuit of claim 2, wherein the transmit engine is configured to translate the debug command to the data stream.

4. The integrated circuit of claim 3, wherein the transmit engine is configured to discard a portion of the debug command based on a length specified in a header of the debug command.

5. The integrated circuit of claim 1, wherein the receive engine is configured to detect an error condition in response to determining that the target debug core provided less debug data than requested by the host system and did not provide an indication of last data being sent within a predetermined amount of time.

6. The integrated circuit of claim 1, further comprising:
a debug packet controller coupled to the high-speed interface, wherein the debug packet controller is configured to process packets of debug data; and
a network-on-chip coupled to the debug packet controller and to the debug hub.

7. A debug hub disposed within an integrated circuit, the debug hub comprising:
a transaction manager configured to receive a debug command from a host system and send debug data to the host system;
a controller configured to control operation of the transaction manager and exchange of the debug command and the debug data with the host system; and
a debug core interface coupled to the controller and to a plurality of debug cores, wherein the debug core interface includes a transmit engine configured to convert the debug command to a transmit data stream and send the debug command to a target debug core of the plurality of debug cores as the transmit data stream;
wherein the transmit engine is configured to discard a portion of the debug command based on a length field specified in a header of the debug command; and
wherein the debug core interface is configured to receive the debug data from the target debug core as a receive data stream and convert the debug data to memory mapped data for sending to the host system.

8. The debug hub of claim 7, wherein the transmit engine has a plurality of transmit channels coupled to the plurality of debug cores, wherein the transmit engine is configured to convert the debug command from memory mapped data to the transmit data stream and send the debug command to the target debug core via a selected transmit channel of the plurality of transmit channels coupled to the target debug core.

9. The debug hub of claim 8, wherein the debug core interface comprises a control interface configured to communicate with a non-streaming debug core.

10. The debug hub of claim 8, wherein the debug core interface comprises:
a receive engine having a plurality of receive channels coupled to the plurality of debug cores, wherein the receive engine is configured to receive the debug data as the receive data stream over a selected receive channel of the plurality of receive channels coupled to the target debug core and convert the debug data to memory mapped data.

11. The debug hub of claim 10, wherein the receive engine is configured to pad the debug data in response to determining that an amount of the debug data received from the target debug core is less than an amount of data requested by the host system and that an indication of last data is received from the target debug core within a predetermined amount of time.

12. The debug hub of claim 10, wherein the receive engine is configured to detect an error condition in response to determining that the target debug core provided less debug data than requested by the host system and did not provide an indication of last data being sent within a predetermined amount of time.

13. The debug hub of claim 10, wherein the debug core interface comprises:
a built-in-self-test circuit coupled to the transmit engine and the receive engine.

14. The debug hub of claim 10, wherein the debug core interface comprises:
a channel select engine configured to select the selected transmit channel and the selected receive channel to communicate with the selected core based on the debug command.

15. The debug hub of claim 7, further comprising:
a source selection circuit configured to selectively pass memory mapped data from a first source corresponding to a high-speed interface coupled to the host system or a second source.

16. The debug hub of claim 15, further comprising:
a boundary scan (BSCAN) to memory mapped converter circuit configured to convert Joint Test Action Group (JTAG) transactions to memory mapped data, wherein the BSCAN to memory mapped converter circuit is the second source.

17. A method, comprising:
receiving, within a debug hub of an integrated circuit, a debug command from a host system, wherein the debug command is received over a high-speed interface coupled to the host system and the debug hub is coupled to a plurality of debug cores of the integrated circuit through a plurality of channels;
determining an address from the debug command, wherein the address corresponds to a selected debug core of the plurality of debug cores and a selected transmit channel of the plurality of channels, wherein the selected transmit channel is connected to the selected debug core;
converting the debug command from memory mapped data to a data stream, wherein a portion of the debug command is discarded based on a length field specified in a header of the debug command; and
sending the debug command to the selected debug core via the selected transmit channel.

18. The method of claim 17, further comprising:
receiving debug data from the selected debug core over a receive channel connected to the selected debug core, wherein the receive channel is one of the plurality of channels;
converting the debug data from a data stream to memory mapped data; and
providing the debug data to the host system.

* * * * *